United States Patent [19]
Cole, Jr. et al.

[11] Patent Number: 5,157,589
[45] Date of Patent: Oct. 20, 1992

[54] MUTLIPLE LAMINATION HIGH DENSITY INTERCONNECT PROCESS AND STRUCTURE EMPLOYING THERMOPLASTIC ADHESIVES HAVING SEQUENTIALLY DECREASING $T_G$'S

[75] Inventors: Herbert S. Cole, Jr., Scotia; James W. Rose, Delmar; Charles W. Eichelberger, Schenectady; Robert J. Wojnarowski, Ballston Lake, all of N.Y.

[73] Assignee: General Electric Company, Schenectady, N.Y.

[21] Appl. No.: 546,963

[22] Filed: Jul. 2, 1990

[51] Int. Cl.⁵ ............................................. H05K 1/11
[52] U.S. Cl. .................................................. 361/414
[58] Field of Search ................... 29/831, 846, 851; 174/250, 259, 260, 261; 357/68, 69, 71, 80; 361/397, 400, 401, 409, 411, 414; 428/34.7, 35.8

[56] References Cited
U.S. PATENT DOCUMENTS

| | | | |
|---|---|---|---|
| 4,246,595 | 1/1981 | Hoyori et al. | 357/69 |
| 4,723,197 | 2/1988 | Takiak et al. | 361/403 |
| 4,789,760 | 12/1988 | Koyama et al. | 361/414 |
| 4,861,164 | 8/1989 | Kleinschmidt et al. | 428/40 |
| 4,897,153 | 1/1990 | Cole et al. | 156/643 |
| 4,914,260 | 4/1990 | Suzuki et al. | 174/256 |
| 4,924,295 | 5/1990 | Küecher | 357/69 |
| 4,933,042 | 1/1990 | Eichelberger et al. | 156/239 |

FOREIGN PATENT DOCUMENTS

WO850366 8/1985 PCT Int'l Appl. .

Primary Examiner—Leo P. Picard
Assistant Examiner—Donald A. Sparks
Attorney, Agent, or Firm—Marvin Snyder; James C. Davis, Jr.

[57] ABSTRACT

A high density interconnect structure incorporating a plurality of laminated dieletric layers is fabricated using thermoplastic adhesive layers of progressively lower glass transition temperature in order to maintain the stability of the already fabricated structure during the addition of the later laminations. This structure also facilitates the removal of only a portion of the high density interconnect structure where a fault in the system can be corrected in one of the upper layers of the high density interconnect structure.

16 Claims, 4 Drawing Sheets

MUTLIPLE LAMINATION HIGH DENSITY INTERCONNECT PROCESS AND STRUCTURE EMPLOYING THERMOPLASTIC ADHESIVES HAVING SEQUENTIALLY DECREASING T$_G$'S

RELATED APPLICATIONS

This application is related to application Ser. No. 07/546,965, filed Jul. 2, 1990, entitled "A High Density Interconnect Structure Including a Spacer Structure and a Gap", by H. S. Cole et al., application Ser. No. 07/546,964, filed Jul. 2, 1990 entitled "High Temperature Polyether Imide Compositions and Method of Making" by J. H. Lupinski et al., and application Ser. No. 07/546,959, filed Jul. 2, 1990, entitled, "Multiple Lamination High Density Interconnect Process and Structure Employing a Variable Crosslinking Adhesive", by T. B. Gorczyca et al., each of which is incorporated herein by reference in its entirety.

BACKGROUND OF THE INVENTION

1. Field of the Invention

The present invention relates to the field of high density interconnect structures for interconnecting electronic components, and more particularly, to such structures employing more than one layer of conductors.

2. Background Information

A high density interconnect (HDI) structure or system which has been developed by General Electric Company offers many advantages in the compact assembly of electronic systems. For example, an electronic system such as a micro computer which incorporates 30-50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components are then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E. I. du Pont de Nemours Company, which is ≈0.0005-0.003 inch (≈12.5-75 microns) thick is pretreated to promote adhesion by reactive ion etching (RIE), the substrate and chips are then coated with ULTEM ® 1000 polyetherimide resin or another thermoplastic and the Kapton film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the patents and applications which are listed hereinafter.

This high density interconnect structure provides many advantages. Included among these are the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; U.S. patent application Ser. No. 454,545, filed Dec. 21, 1989, entitled "An Epoxy/Polyimide Copolymer Blend Dielectric and Layered Circuits Incorporating It" by C. W. Eichelberger, et al.; application Ser. No. 07/504,760, filed Apr. 5, 1990, entitled, "A Building Block Approach to Microwave Modules", by W. P. Kornrumpf et al.; application Ser. No. 07/504,821, filed Apr. 5, 1990, entitled, "HDI Microwave Circuit Assembly", by W. P. Kornrumpf, et al.; application Ser. No. 07/504,750 filed Apr. 5, 1990, entitled, "An Ultrasonic Array With a High Density of Electrical Connections", by L. S. Smith, et al.; application Ser. No. 07/504,803, filed Apr. 5, 1990, entitled, "Microwave Component Test Method and Apparatus", by W. P. Kornrumpf, et al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et al.; application Ser. No. 07/504,751, filed Apr. 5, 1990, entitled, "Compact, Thermally Efficient Focal Plane Array and Testing and Repair Thereof", by W. P. Kornrumpf, et al.; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et al.; and application Ser. No. 07/504,748, filed Apr. 5, 1990, entitled, "Microwave Component Having Tailored Operating Characteristics and Method of Tailoring" by W. P. Kornrumpf, et al. Each of these Patents and Patent Applications is incorporated herein by reference.

Any additional dielectric layers which are required for isolation between the first metallization layer and any subsequent metallization layers or for prevention of short circuits due to contact with external conductors are formed by spinning on or spraying on a solvent solution of a desired thermoplastic dielectric material. The structure is then baked to drive off the solvent in order to leave a solvent-free dielectric layer. Alternatively, in accordance with U.S. patent application Ser. No. 454,545, entitled, "An Epoxy/Polyimide Copolymer Blend Dielectric and Layered Circuits Incorporating It" a siloxane-polyimide/epoxy blend may be spun-on, dried and cured to provide this dielectric layer. Thereafter, via holes are formed as needed and a patterned metallization layer is formed thereover which is disposed in ohmic contact with underlying metal in the via holes. If needed, further dielectric and metallization layers are formed thereover in a similar manner. Unfortunately, there are a limited number of dielectric materials which are suitable for use as these upper dielectric layers because of all of the material properties they must exhibit. Not only must the dielectric material be available as a spin-on or spray-on solution, it must also provide good adhesion to the underlying dielectric and metallization and to the material of any overlying metallization or dielectric layer which may subsequently be formed thereon and it should be inherently laser ablatable or it should be rendered laser ablatable in accordance with U.S. patent application Ser. No. 456,421, entitled, "Laser Ablatable Polymer Dielectrics and Methods".

By a thermoplastic polymer material, we mean a polymer material which after multiple cycles of heating and cooling substantially retains its initial melting point or glass transition temperature. That is, no substantial crosslinking of the material takes place during the heating, melting and resolidification process. Such polymers are suitable as adhesive layers for bonding higher temperature materials, including polymers to substrates and may also themselves be used as layers to be bonded to substrates through the use of lower temperature adhesive layers. The glass transition temperature of a polymer is the temperature above which the viscosity of the polymer decreases greatly, thereby allowing the polymer to flow and also to bond to other materials. When cooled below this glass transition temperature, the thermoplastic polymer "resolidifies" and remains adherent to objects with which it is in intimate contact. By a thermoset polymer material, we mean a polymer material in which cross-linking takes place the first time it is heated or during its preparation process, such that the material either no longer melts or melts at a much higher temperature than it did prior to its initial heating or its formation, as the case may be.

While the use of spin-on or spray-on dielectric layers for the second and higher dielectric layers of a high density interconnect structure is effective, it has a number of potential drawbacks and process complications. In particular, such dielectric layers must be baked to drive off their solvent. The baking time and temperature profiles involved can adversely affect some electronic components. Further, in some situations, there is poor adhesion between adjacent dielectric layers. In other situations, excessive stress in the dielectric layers or at the interface between adjacent dielectric layers can adversely affect the quality and reliability of a high density interconnect structure. During the coating of further dielectric layers, the solvent vehicle tends to redissolve the surface portion of an already formed, unreacted, thermoplastic dielectric layer on which it is disposed. While this tends to improve adhesion, it can also result in excessive interfacial stress and cracking or crazing of the dielectric layers which renders the structure unusable.

There are known techniques for using thermoset materials as adhesives in the formation of multilayer printed circuit boards. These include spinning on a precursor of a thermoset material and reacting it in place to form a thermoset dielectric layer. Once such a layer has reacted, it is no longer soluble in the solvent which is used in forming the next layer with the result that damage to underlying layers does not occur during the formation of subsequent layers. Such materials are available from Sheldahl Corporation.

Another thermoset technique is the type of laminate used in making laminated circuit boards. These include the copper dielectric laminate available under the trademark Pyrolux ® from Dupont. These systems use acrylate adhesives which become thermoset at a curing temperature of about 135° C. Unfortunately, acrylate adhesives are not considered sufficiently thermally stable for use in most high density interconnect structures of the type to which the present invention is directed and once reacted generally don't solvent at all. In particular, it is considered desirable to be able to operate these high density interconnect structure systems in the vicinity of 200° C. or higher. Acrylates are not considered usable above 150° C. Epoxies also exhibit thermal instabilities which prevent their use at these temperatures. In particular, most epoxies turn tan at 150° C. and turn black at 180° C.

Printed circuit boards made by either of these techniques cannot be disassembled for repair and most of those printed circuit boards which are faulty must be discarded. Printed circuit boards of whatever type are fully tested prior to mounting expensive components thereon. Consequently, expensive chips are not committed to faulty printed circuit boards. While this lack of repairability is a disadvantage, it is more than offset for printed circuit board applications by the combination of relatively high testing yield and the high durability the thermoset structure imparts to the circuit board.

While use of a thermoset structure is beneficial in the printed circuit board art, the use of such thermoset systems is unacceptable in a high density interconnect structure of the type to which this invention is directed because the expensive chips are put in place before the interconnection structure is built. As a result, any fault in a thermoset high density interconnect structure would require scrapping not only of the interconnection structure itself, but all of the chips as well. Thus, the conversion of a high density interconnect structure of the type described above into one having a thermoset structure is not a solution to the problems associated with the formation of multilayered high density interconnect structures The use of multiple thermoset dielectric layers which are laminated to the structure using a thermoplastic adhesive to provide such a multilayer structure in which each dielectric layer includes a thermoset upper sublayer and a thermoplastic lower sublayer as discussed in U.S. Pat. No. 4,783,695 has not been implemented because of the tendency for the early laminated layers to shift, deform or otherwise change during the lamination of subsequent layers in a way which breaks via connections between layers.

This problem should be at least partially solved by the multiple lamination process taught in related application Ser. No. 07/546,959, entitled, "Multiple Lamination High Density Interconnect Process and Structure Employing a Variable Crosslinking Adhesive", since that process employs a crosslinking adhesive to bond a thermoset or high temperature thermoplastic laminated layer over each metallization layer. However, that multilayer structure itself is not repairable.

Consequently, an alternative process for providing additional dielectric layers which avoids the problems associated with multiple layers of spun-on thermoplastic dielectrics is desirable.

OBJECTS OF THE INVENTION

Accordingly, a primary object of the present invention is to provide upper layer dielectrics in a high density interconnect structure by a process which avoids solvent deposition and baking of those dielectric layers.

Another object of the present invention is to provide a planar multi-laminated high density interconnect structure whose fabrication avoids the problem of via interconnection destruction during fabrication.

Another object of the present invention is to provide a planar multi-laminated high density interconnect structure which is laminated using progressively lower $T_g$ thermoplastic adhesives.

Another object of the present invention is to provide greater versatility and variety in high density interconnect structures, the materials of which they are fabricated and the process of fabricating them.

Another object of the present invention is to provide repair for each laminated layer in a high density interconnect structure without the need for total dielectric and interconnect removal.

SUMMARY OF THE INVENTION

The above and other objects which will become apparent from the specification as a whole, including the drawings, are accomplished in accordance with the present invention by using multiple laminations to provide the dielectric layers in a high density interconnect structure through use of different adhesives in the different laminating steps with each successive laminating step employing a thermoplastic adhesive having a lower $T_g$ than the thermoplastic adhesive employed in the preceding lamination step and being performed at a low enough temperature that previous dielectric layers are not adversely affected.

In accordance with one embodiment of the invention, a high density interconnect structure is fabricated by laminating a first dielectric film over the electronic components using a first thermoplastic adhesive having a first glass transition temperature ($T_{g1}$), forming via holes in that dielectric layer in alignment with the contact pads to which contact is to be made, forming a patterned metallization layer on top of that first dielectric layer, laminating a second dielectric film over the first metallization layer and the exposed portions of the first dielectric layer by employing a second thermoplastic adhesive having a second glass transition temperature $T_{g2}$ which is lower than $T_{g1}$. This second lamination step is carried out at a temperature which is low enough that via connections between the first metallization layer and contact pads on the electronic components are neither destroyed nor otherwise adversely affected. After completion of the second lamination step, via holes are formed in the second dielectric layer in alignment with conductors to which it is desired to form electrical contacts. These conductors may be conductors of the first metallization layer or contact pads of the electronic components. A second metallization layer is then formed over the second dielectric layer and patterned appropriately. If more conductive layers are required, additional dielectric films may be laminated to the structure with still lower $T_g$ adhesives and appropriate conductive layers may be formed thereover.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
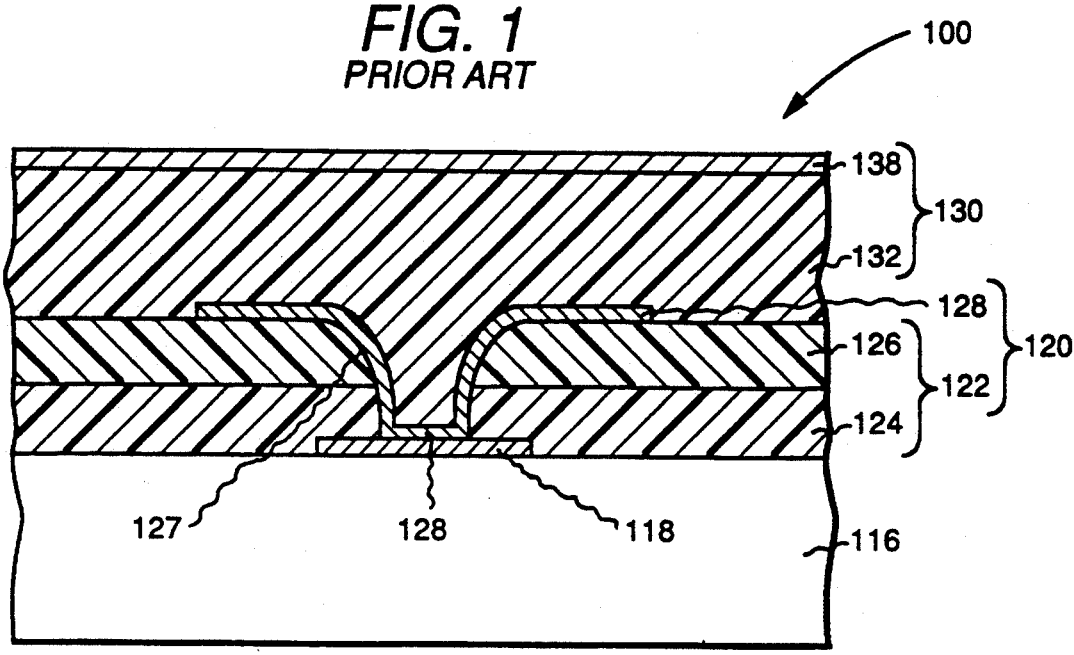
FIG. 1 is a schematic cross-section view of a typical first level via connection in a prior art high density interconnect structure having spun-on upper dielectric layers.

In FIG. 1, a small portion 100 of a prior art high density interconnect structure which includes a first level via connection is illustrated in cross-section. This high density interconnect structure includes a laminated first dielectric layer 122 and a spun-on second dielectric layer 132. This structure comprises a chip 116 having a contact pad 118 on its upper surface. A first layer 120 of the overlying high density interconnect structure comprises a dielectric layer 122 and a patterned metallization layer 128. The dielectric layer 122 has separate lower and upper sublayers 124 and 126, respectively. The sublayer 124 is a thermoplastic adhesive such as ULTEM ® 1000 polyetherimide resin available from General Electric Company and the sublayer 126 is a Kapton ® polyimide thermoset film, available from E. I. du Pont de Nemours Company. The metallization 128 extends down into a via hole 127 and into ohmic contact with the contact pad 118. The sidewalls of the via hole are sloped upward and outward as a result of its formation by laser drilling. A second layer 130 of the high density interconnect structure is disposed on layer 120 and comprises a dielectric layer 132 and a patterned metallization layer 138. The dielectric layer 132 is a spun-on thermoplastic layer such as SPI siloxane polyimide available from HULS America.

For failure analysis we cross-sectioned multilayer laminates which we made previously in which each dielectric layer consisted of a thermoplastic lower layer and a thermoset upper layer and in which via connections were destroyed during the process of laminating subsequent dielectric layer.

Figure 2:
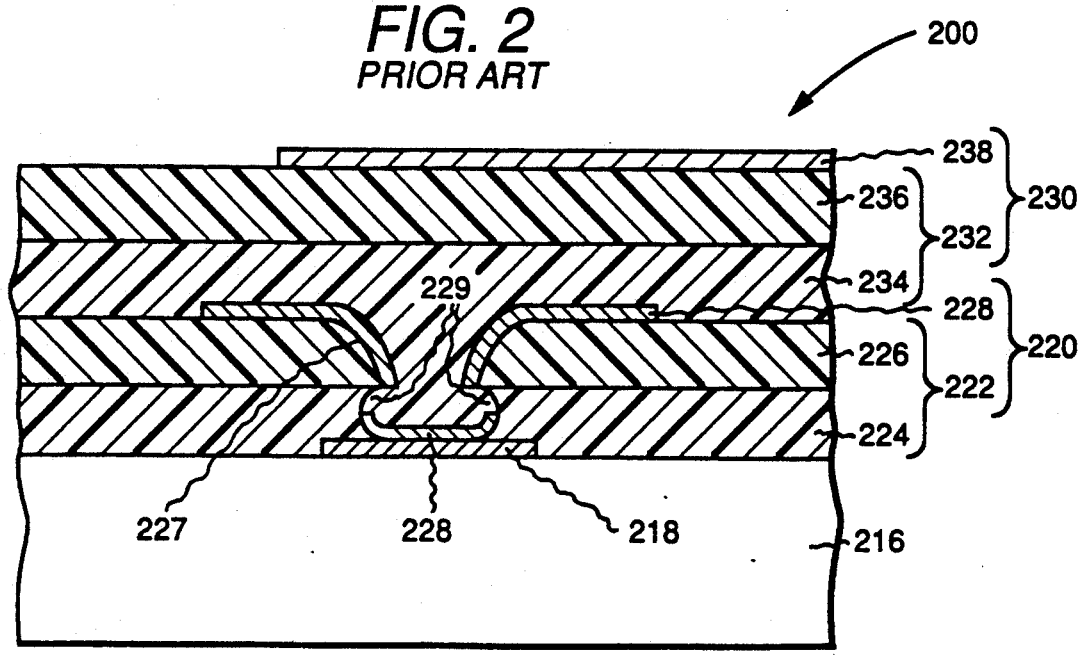
FIG. 2 is a schematic cross-section view of a broken via connection in a multi-laminate structure employing a thermoplastic adhesive.

FIG. 2 illustrates a small portion of such a cross-section. The cross-sectioned high density interconnect structure 200 includes laminated first and second dielectric layers 222 and 232, respectively. This structure comprises a chip 216 having a contact pad 218 on its upper surface. A first layer 220 of the overlying high density interconnect structure comprises a dielectric layer 222 and a patterned metallization layer 228. The dielectric layer 222 has separate lower and upper sublayers 224 and 226, respectively.

The lower sublayer 224 is an ULTEM ® 1000 polyetherimide resin available from General Electric Company thermoplastic adhesive and the upper sublayer 226 is a KAPTON ® polyimide thermoset film available from E. I. DuPont de Nemours. The metallization 228 extends down into a via hole 227 and includes a portion disposed in ohmic contact with the contact pad 218. The upper part of the sidewalls of the via hole 227 are sloped upward and outward as a result of its formation by laser drilling. A second layer 230 of the high density interconnect structure is disposed on layer 220 and comprises a dielectric layer 232 and a patterned metallization layer 238. The dielectric layer 232 has separate lower and upper sublayers 234 and 236, respectively. The lower sublayer 234 is an ULTEM ® 1000 polyetherimide resin available from General Electric Company thermoplastic adhesive and the upper sublayer 236 is a KAPTON ® polyimide thermoset film available from E. I. DuPont de Nemours.

The broken via shown in FIG. 2 is typical of broken vias we sectioned in that the via has been expanded into the space underneath the thermoset upper sublayer 226 portion of the lower dielectric layer 222. The metallization of the via is typically fractured at the lower edge of the upper sublayer 226, leaving a gap 229 in metallization 228. This post-lamination via configuration results from the thermoplastic adhesive 234 of the second dielectric layer pushing down into the via and applying side-wise pressure which causes the second adhesive 234 to flow in under the thermoset sublayer 226 of the first dielectric layer as the adhesive 234 pushes the metallization ahead of it, in underneath that thermoset sublayer 226, with the metallization in turn pushing the adhesive sublayer 224 of the first dielectric layer ahead of it. We concluded that this is a result of that second lamination being done at a temperature at which the thermoplastic adhesive of the first dielectric layer is sufficiently fluid that the pressure applied to the via sidewalls during the second lamination step can cause the first layer thermoplastic adhesive 224 to recede from the via. This problem is avoided in the prior art thermoset adhesive printed circuit board art by the thermosetting of that first adhesive layer prior to laminating the second dielectric layer. As has been discussed above, such a solution is not acceptable in high density interconnect structures of the type with which we are concerned. We therefore concluded that a solution to this problem is performing subsequent laminations at low enough temperatures and lamination pressures that the first layer thermoplastic adhesive does not flow.

Figure 3:
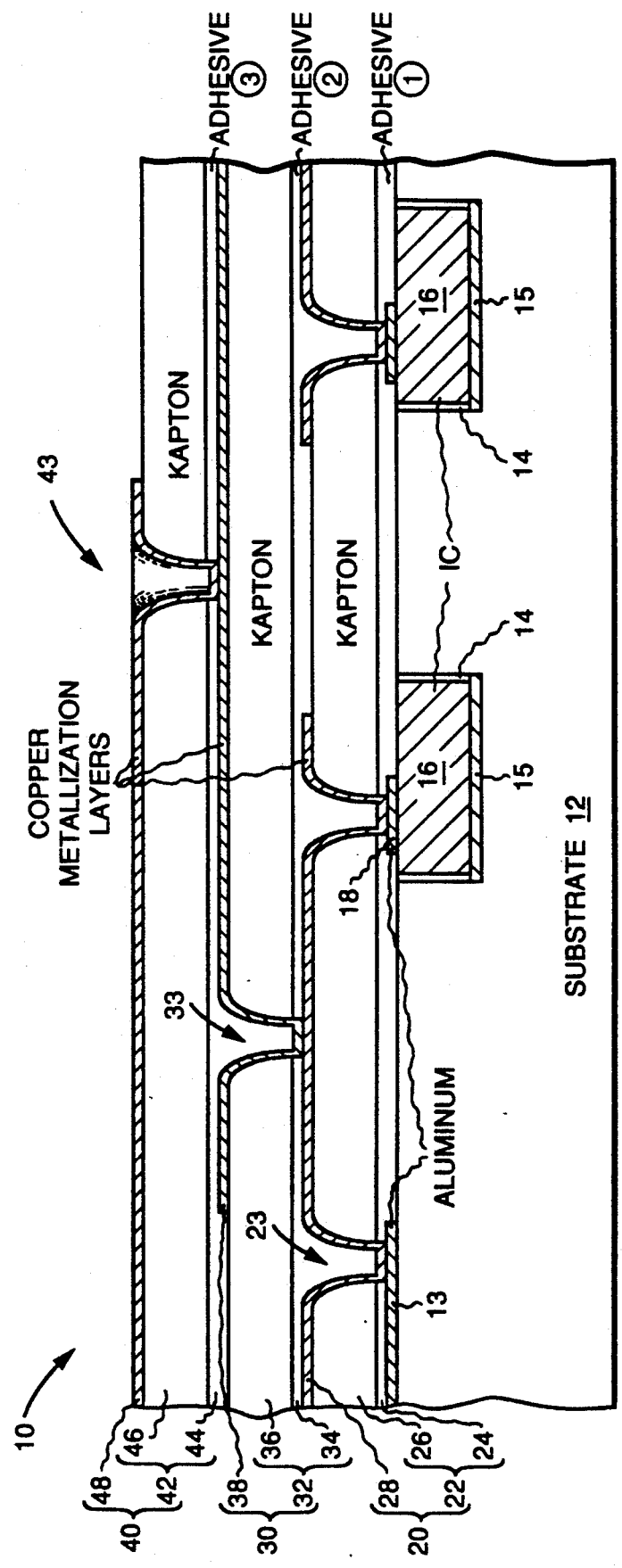
FIG. 3 is a cross-section view of a high density interconnect structure in accordance with the present invention.

A high density interconnect structure 10 in accordance with the present invention is illustrated in a cross-section view in FIG. 3. The high density interconnect structure 10 comprises a substrate 12 having cavities 14 in the upper surface thereof in which integrated circuit chips 16 or other electronic components are disposed. For many high density interconnect structures, these electronic components are bonded to the substrate with a thermoplastic adhesive 15. These electronic components have contact pads 18 on an (upper) contact surface thereof. The substrate 12 may have conductive runs 13 disposed on the upper surface thereof. A first layer 20 of the overlying high density interconnect structure 10 comprises a dielectric layer 22 and a patterned metallization layer 28. The dielectric layer 22 has separate lower and upper sublayers 24 and 26, respectively. The layer 24 is a thermoplastic adhesive having a first glass transition temperature $T_{g1}$. The layer 26 may be a thermoset material or a thermoplastic material having a higher $T_g$ than $T_{g1}$. Where the components or chips are bonded to the substrate with a thermoplastic chip adhesive 15, it is preferred that the chip adhesive have a glass transition temperature ($T_{g0}$) which is higher than $T_{g1}$. The upper sublayer 26 of the first dielectric layer 22 should be stable over a range of temperatures above $T_{g1}$ in order that it will remain stable during its lamination to the chips during the fabrication process. It is preferred that layer 26 be stable at least 100° C. above $T_{g1}$. By stable, we mean it has sufficient viscosity that it doesn't shift, stretch or otherwise change in an undesirable manner during the lamination step. This layer 26 is preferably a thermoset film, for example, Kapton ® which is sold by E. I. DuPont de Nemours. Other materials, including thermoplastics, which exhibit sufficient stability may also be used. The patterned metallization layer 28 extends into contact with contact pads 18 and conductor runs 13, if any, on the substrate 12 within via holes 23 in the dielectric layer 22.

Figure 5:
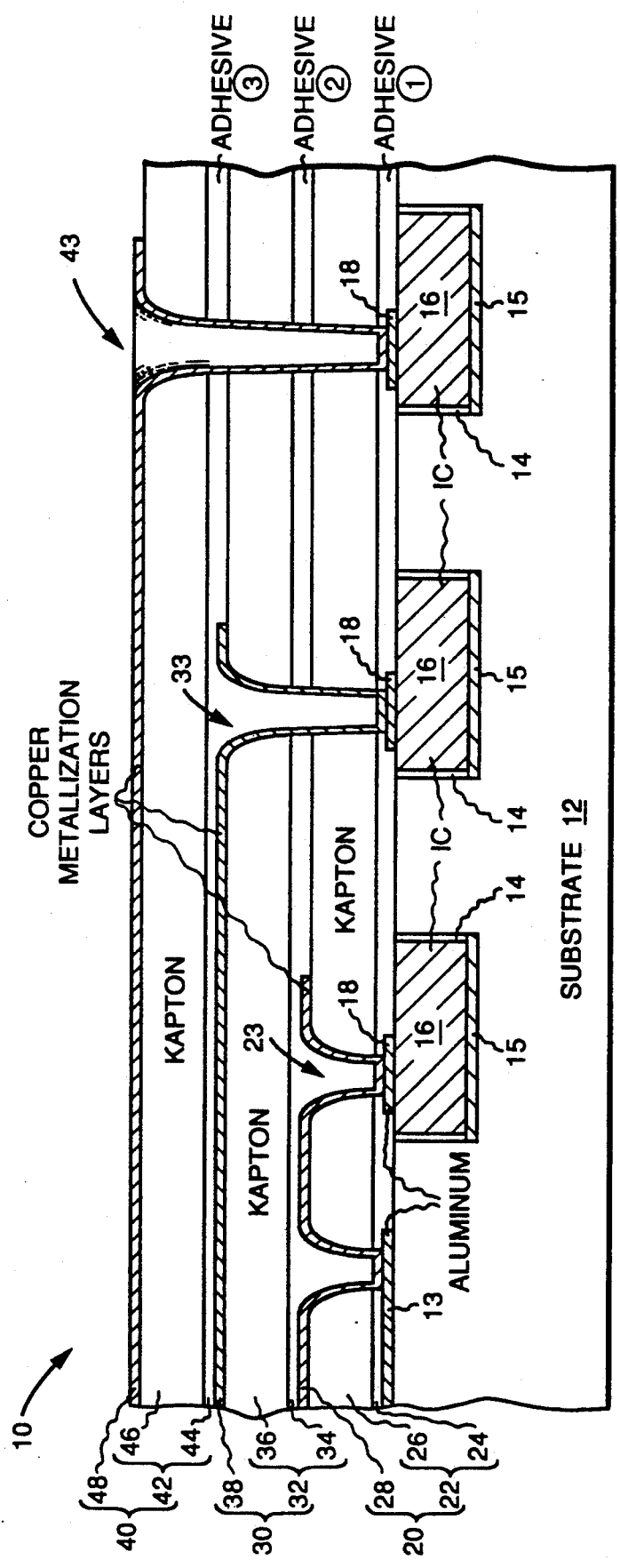
FIG. 5 is a cross-section view of another embodiment of a high density interconnect structure in accordance with the present invention.

A second layer 30 of the high density interconnect structure comprises a second dielectric layer 32 and a second patterned metallization layer 38. The dielectric layer 32 has separate lower and upper sublayers 34 and 36, respectively. The second lower sublayer 34 has a second glass transition temperature $T_{g2}$ and the upper sublayer 36 may again be a thermoset material or a thermoplastic material having a $T_g$ which is higher than $T_{g2}$. The patterned metallization 38 extends into via holes 33 in the dielectric layer 32 to make contact with the first metallization layer 28. If desired, selected via holes 33 may extend through dielectric layer 22 as well to provide direct contact to selected contact pads, as shown in FIG. 5. However, that is not preferred because of the added processing complexity which results from having via holes of different depths.

In FIG. 3, a third layer of the high density interconnect structure 40 comprises a dielectric layer 42 and a patterned metallization layer 48. As discussed above for the second layer, the patterned metallization layer 48 extends into via holes 43 in the dielectric layer 42 to make contact with the metallization layer 38, as shown in FIG. 3. Alternatively, selected via holes 43 may extend through dielectric layers 32 and 22 as well as to provide direct contact to selected contact pads, as shown in FIG. 5. The dielectric layer 42 has separate lower and upper sublayers 44 and 46 as shown in FIG. 3. The third lower sublayer 44 has a glass transition temperature $T_{g3}$ which is lower than $T_{g2}$. The third upper dielectric sublayer 46 may be a thermoset material or a thermoplastic material having a higher glass transition temperature than $T_{g3}$.

In this structure, the thermoplastic adhesive materials 24, 34 and 44 are selected so that their glass transition temperatures decrease progressively. That is, $T_{g1} > T_{g2} > T_{g3}$. This difference in glass transition temperatures is selected in order that the second dielectric layer may be laminated onto the first layer of the high density interconnect structure at a temperature at which the first thermoplastic adhesive layer 24 is sufficiently stable that the via connections between the first metallization layer 28 and the contact pads 18 and metallization runs 13 on the substrate will not be disturbed. The required difference between $T_{g1}$ and $T_{g2}$ depends on the particular characteristics of the thermoplastic materials. Where the sublayer 34 changes viscosity rapidly with temperature at its $T_g$, a lesser difference in $T_g$'s is required than is the case where the viscosity of the dielectric adhesive 34 changes only slowly with temperature. This is because the rapid change in viscosity with temperature allows the second lamination step to be carried out at substantially the $T_g$ of that material without a need to heat the structure significantly above that temperature. The required difference between $T_{g2}$ and $T_{g3}$ involves similar considerations. Since it is desirable that the final structure be able to operate at high temperatures, it is desirable that the $T_g$'s of the various adhesive layers differ by as little as possible, while still permitting the reliable fabrication of the overall structure. Thus, this invention involves the use of thermoplastic adhesives which exhibit differential melting characteristics as a function of temperature.

A variety of different adhesive materials are available and suitable for use in this structure. The $T_g$'s of these materials range from greater than 300° C. to the vicinity of 150° C. or lower. Where the chips 16 are bonded to the substrate 12 by a thermoplastic adhesive 15, the highest $T_g$ adhesive is preferably used to bond the chips to the substrate with progressively lower $T_g$ adhesives used for the laminations.

A sequence of thermoplastic adhesives having appropriately stepped $T_g$'s is:

| Adhesive | Polymer Type | Source | $T_g$ | Approximate Lamination Temperature |
|---|---|---|---|---|
| XU-218 | polyimide | CIBA-GEIGY | 320° C. | 360° C. |
| ULTEM II | polyether-imide | GE | 275° C. | 350° C. |
| BPADA/SDAN* | sulfonyl-polyether-imide | GE | 250° C. | 310° C. |
| ULTEM 6000 | polyether-imide | GE | 237° C. | 300° C. |
| ULTEM 1000 | polyether-imide | GE | 216° C. | 280° C. |
| SPI 100 | siloxane-polyimide | HULS America, Inc. | 137° C. | 200° C. |
| M&T 2065 | siloxane-polyimide | M&T Chemicals | 85° C. | 160° C. |
| Polyester T-320 | polyester | Sheldahl Corp. | 120° C. | 150° C. |
| ELVAX 410 | ethylene-vinyl acetate copolymer | DuPont | 85° C. | 120° C. |

*A polymer made from bis(4-aminophenyl) sulfone and bis phenol A dianhydride and further disclosed in copending application Ser. No. 07/546,964, entitled, "High Temperature Polyether Imide Compositions and Method of Making".

It is also possible to blend thermoplastic adhesives with difference $T_g$ values to obtain a desired $T_g$ and laminating temperature which is otherwise unobtainable. Examples of this are found in copending application Ser. No. 07/546,964.

It is also noted that numerous other thermoplastic adhesives are commercially available and their physical properties well characterized. Potential materials for use in this invention can be found from sources such as "Plastics; Thermoplastics and Thermosets", published by The International Plastics Selector, Inc.

Figure 4:
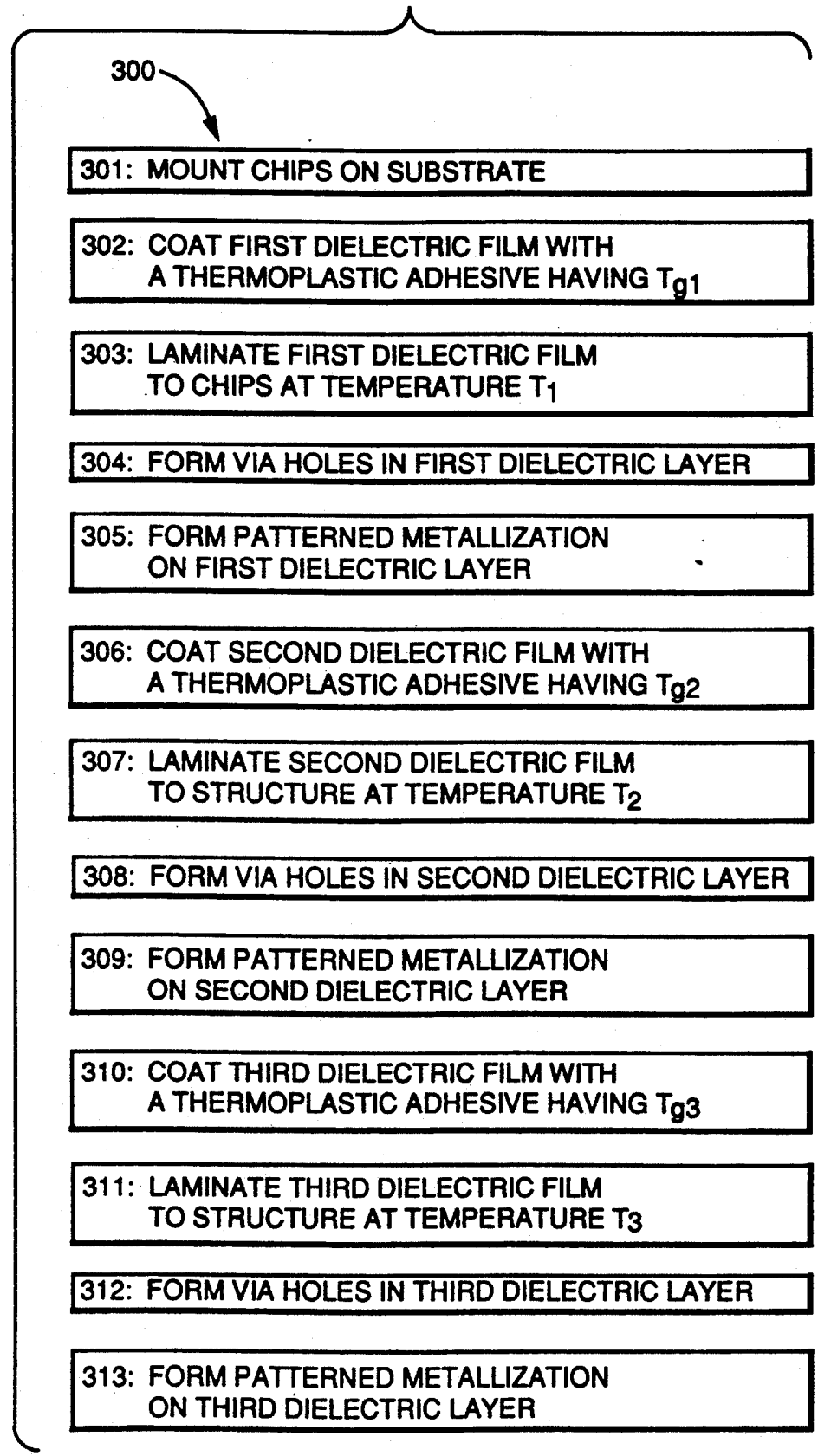
FIG. 4 is an illustration of the process steps involved in fabrication of the FIG. 3 structure.

A preferred process 300 for producing the structure shown in FIG. 3 is illustrated in FIG. 4.

The process 300 begins with a first step 301 of mounting the chips on the substrate 12. This mounting may be intended to be permanent where the substrate will remain part of the completed structure or may be intended to be temporary where the substrate will be removed following completion of the fabrication process in order to provide a flexible high density interconnect structure.

In step 302, the first upper sublayer 26 of dielectric material is coated with a thermoplastic adhesive 24. The thermoplastic adhesive 24 has a first glass transition temperature $T_{g1}$.

In step 303, this first dielectric layer is laminated to the chips and substrate at a first lamination temperature $T_1$.

Next, in step 304, the via holes 23 are formed in this first dielectric layer.

In step 305, a patterned metallization layer 28 is formed on this first dielectric layer. This may be done by any of the variety of techniques taught in the listed patents or by other patterned deposition or uniform deposition followed by patterning techniques. This completes the fabrication of the first layer 20 of the high density interconnect structure, as illustrated in FIG. 3.

In step 306, the second upper sublayer 36 dielectric material is coated with a thermoplastic adhesive 34 having second glass transition temperature $T_{g2}$, which is lower than the first glass transition temperature $T_{g1}$. This adhesive layer should be thicker than the metallization runs it is to cover in order to avoid leaving voids in the structure adjacent those metallization runs at the completion of the laminating step.

In step 307, this second dielectric layer is laminated on top of the existing structure, that is, on top of the patterned metallization layer 28 and exposed portions of the first dielectric layer 22. This second lamination step is carried out at a temperature $T_2$, which is lower than the first lamination temperature $T_1$.

In step 308, via holes are formed in this second dielectric layer.

In step 309, a second patterned metallization layer 38 is formed on top of the second dielectric layer 32 using the same or a different metallization technique as was used for the first metallization layer, as may be desired.

This completes the fabrication of the second layer 30 of a high density interconnect structure of FIG. 3.

Where a third layer 40 of the high density interconnect structure is desired, as shown in FIG. 3, the process continues in step 310 with coating the third upper dielectric sublayer 46 with a third thermoplastic adhesive having a third glass transition temperature $T_{g3}$ which is lower than $T_{g2}$.

In step 311, this third dielectric layer is laminated to the existing structure at a temperature $T_3$, that is, to the patterned metallization layer 38 and exposed portions of the dielectric layer 32. The temperature $T_3$ is lower than the temperature $T_2$.

In step 312, via holes 43 are formed in the third dielectric layer 42 and in step 313, a third patterned metallization layer 48 is formed on the third dielectric layer.

As has been discussed, the temperatures $T_1$, $T_2$ and $T_3$ are selected so that $T_1 > T_2 > T_3$ in order that each of the underlying layers of the high density interconnect structure will remain stable during the subsequent laminating steps. The required difference in temperature at successive lamination steps depends on the particular adhesives and other lamination conditions employed.

It will be understood that the lamination which employs an adhesive with $T_{g2}$ can be performed at a temperature above $T_{g1}$, so long as the first adhesive is sufficiently stable at that lamination temperature that no shifting or breakage of via interconnections takes place. Thus, with appropriate control of the lamination temperatures and other lamination conditions, the nine adhesives listed in the table, or blends prepared from these adhesives, make a nine lamination structure feasible. Obviously, most circuits, even very complex ones, can be interconnected in a structure which includes substantially fewer laminations than nine. The lamination temperatures of BPADA/SDAN and ULTEM 6000, 310° C. and 300° C., respectively and those of M&T 2065 and polyester T-230, 160° C. and 150° C., respectively, are close enough together that use of both materials in each pair in the same structure should be carefully controlled or avoided.

Each of these adhesives is either inherently laser drillable at 351 nm or may be modified to be so in accordance with application Ser. No. 456,421, filed Dec. 26, 1989, entitled "Laser Ablatable Polymer Dielectrics and Methods" by H. S. Cole et al.

For the sake of repairability of the assembled structure, each of the adhesive layers should to remain a thermoplastic throughout the life of the structure in order to facilitate repair of the structure in the event that one of the electronic components or a portion of the interconnect structure should be found to be faulty.

As is described in some of the backgrouhd patents, the structure can be repaired by removing the overlay structure by heating the overall structure to above the glass transition temperature of the adhesive layer 24 and then peeling the high density interconnect structure off the substrate and electronic components 16. The present invention provides additional versatility because by appropriately controlling the temperature to which the structure is heated, only selected layers of the high density interconnect structure need be removed where the fault is in the interconnect structure itself, rather than in one of the electronic components.

While in FIG. 3 the structure is illustrated as including a substrate 12, it should be understood that in accordance with application Ser. No. 250,010, entitled, "High Density Interconnect With High Volumetric Efficiency" and application Ser. No. 07/504,769, entitled, "A Flexible High Density Interconnect Structure and Flexibly Interconnected System", the substrate may be removed following fabrication of the interconnect structure to leave the electronic components 16 bonded directly to the high density interconnect structure and otherwise unsupported.

It is preferred at each lamination step to coat the upper sublayer with the thermoplastic adhesive prior to adding it to the high density interconnect structure. However, if desired, the thermoplastic adhesive may be applied on top of the high density interconnect structure prior to applying the upper sublayer either with an additional layer of that thermoplastic adhesive disposed on the upper sublayer or without further adhesive thereon.

It will be recognized that in any of these structures, a final upper spun-on dielectric layer may be used, either for insulation purposes only or to support a final metallization layer. This avoids those problems with spun-on layers which arise only when a second spun-on layer is applied.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A high density interconnect structure comprising:
   a plurality of semiconductor chips each having contact pads on a first surface thereof;
   a first layer of dielectric material bonded to said semiconductor chips, said first layer of dielectric material comprising first lower and first upper sublayers, said first lower sublayer being thermoplastic and having a first glass transition temperature $T_{g1}$, said first upper sublayer being stable over a range of temperatures above said first glass transition temperature, said first layer of dielectric material having via holes therein disposed in alignment with at least some of said contact pads;
   a patterned first metallization layer disposed on said first layer of dielectric material and extending into contact with at least some of said contact pads in said via holes in said first layer of dielectric material;
   a second layer of dielectric material bonded to said first metallization layer and exposed portions of said first layer of dielectric material, said second layer of dielectric material comprising second lower and second upper sublayers, said second lower sublayer being thermoplastic and having a second glass transition temperature $T_{g2}$, said second upper sublayer being stable over a range of temperatures above said second glass transition temperature; and
   said first glass transition temperature being higher than said second glass transition temperature.

2. The high density interconnect structure recited in claim 1 wherein:
   said second layer of dielectric material has via holes therein disposed in alignment with some of said contact pads and/or portions of said first metallization layer; and
   said high density interconnect structure further comprises:

a patterned second metallization layer disposed on said second layer of dielectric material and extending into contact with selected contact pads and/or selected portions of said first metallization layer in said via holes in said second layer of dielectric material.

3. The high density interconnect structure recited in claim 2 further comprising:
a third layer of dielectric material bonded to said second metallization layer and exposed portions of said second layer of dielectric material, said third layer of dielectric material comprising third lower and third upper sublayers, said third lower sublayer being thermoplastic and having a third glass transition temperature $T_{g3}$, said third upper sublayer being stable over a range of temperatures above said third glass transition temperature, $T_{g3}$ being less than $T_{g2}$.

4. The high density interconnect structure recited in claim 3 wherein:
said third layer of dielectric material has via holes therein disposed in alignment with some of said contact pads and/or portions of said first metallization layer and/or portions of said second metallization layer; and
said high density interconnect structure further comprises:
a patterned third metallization layer disposed on said third layer of dielectric material and extending into contact with selected contact pads and/or selected portions of said first metallization layer and/or portions of said second metallization layer in said via holes in said third layer of dielectric material.

5. The high density interconnect structure recited in claim 1 wherein:
said second layer of dielectric material has via holes therein disposed in alignment with at least some portions of said first metallization layer; and said high density interconnect structure further comprises:
a patterned second metallization layer disposed on said second layer of dielectric material and extending into contact with at least some portions of said first metallization layer in said via holes in said second layer of dielectric material.

6. The high density interconnect structure recited in claim 1 wherein:
said first and second upper sublayers are thermoset polymers.

7. The high density interconnect structure recited in claim 6 wherein:
said first and second upper sublayers are thermoset polyimide.

8. The high density interconnect structure recited in claim 6 wherein:
said first lower sublayer comprises polyetherimide; and said second lower sublayer comprises a siloxanepolyimide.

9. The high density interconnect structure recited in claim 6 wherein:
said first lower sublayer comprises a sulfonylpolyetherimide; and
said second lower sublayer comprises polyetherimide.

10. The high density interconnect structure recited in claim 6 wherein:
said first lower sublayer comprises a sulfonylpolyetherimide; and
said second lower sublayer comprises a siloxanepolyimide.

11. The high density interconnect structure recited in claim 6 wherein:
said first lower sublayer comprises a polyetherimide; and
said second lower sublayer comprises a polyester.

12. The high density interconnect structure recited in claim 1 wherein:
at least one of said upper sublayers is thermoplastic.

13. The high density interconnect structure recited in claim 12 wherein:
said first and second upper sublayers are thermoplastic.

14. In a method of fabricating a high density interconnected system of the type including a plurality of electronic chips, a high density interconnect structure including a layer of dielectric material bonded to said chips and a pattern of conductors disposed on or in said dielectric material, the conductors of said high density interconnect structure electrically interconnecting said electronic chips, the improvement comprising:
a) laminating a first dielectric layer to said chips using a first thermoplastic adhesive having a first glass transition temperature $T_{g1}$;
b) forming via holes in said first dielectric layer and said first adhesive in alignment with at least some contact pads of said chips;
c) forming a patterned first metallization layer on said first dielectric layer, said first metallization layer including conductors which extend into ohmic contact with contact pads in said via holes;
d) laminating a second dielectric layer to said first metallization layer and exposed portions of said first dielectric layer using a second thermoplastic adhesive having a second glass transition temperature $T_{g2}$ which is lower than said first glass transition temperature, this laminating step being performed at a low enough temperature that said first dielectric layer remains fixed, whereby said first metallization layer and its contacts to said contact pads are not adversely affected by this laminating step.

15. The improvement recited in claim 14 further comprising the steps of:
e) forming second layer via holes in said second dielectric layer and said second adhesive in alignment with said contact pads and/or said first metallization layer; and
f) forming a patterned second metallization layer on said second dielectric layer, said second metallization layer including conductors which extend into ohmic contact with conductors of said first metallization layer and/or said contact pads in said second layer via holes.

16. The improvement recited in claim 15 further comprising the step of:
f) laminating a third dielectric layer to said second metallization layer and exposed portions of said second dielectric layer using a third thermoplastic adhesive having a third glass transition temperature $T_{g3}$ which is lower than said second glass transition temperature, this laminating step being performed at a low enough temperature that said first and second dielectric layers remain fixed, whereby said second metallization layer and its contacts to said contact pads and/or said first metallization layer are not adversely affected by this laminating step and said first metallization layer and its contacts to said contact pads are not adversely affected by this laminating step.

* * * * *